United States Patent [19]

Crossley

[11] 4,170,500

[45] Oct. 9, 1979

[54] PROCESS FOR FORMING FIELD DIELECTRIC REGIONS IN SEMICONDUCTOR STRUCTURES WITHOUT ENCROACHING ON DEVICE REGIONS

[75] Inventor: Peter A. Crossley, Garden Grove, Calif.

[73] Assignee: Fairchild Camera and Instrument Corporation, Mountain View, Calif.

[21] Appl. No.: 3,674

[22] Filed: Jan. 15, 1979

[51] Int. Cl.² ............... H01L 21/265; H01L 21/225; H01L 21/22

[52] U.S. Cl. .................................... 148/187; 148/1.5; 357/23; 357/59; 427/86

[58] Field of Search ............... 148/187, 1.5; 357/23, 357/59; 427/86, 87

[56] References Cited

U.S. PATENT DOCUMENTS

| | | | |
|---|---|---|---|
| 3,899,373 | 8/1975 | Antipov | 148/187 |
| 3,912,557 | 10/1975 | Hochberg | 148/187 |
| 3,966,501 | 6/1976 | Nomura et al. | 148/1.5 |
| 4,030,952 | 6/1977 | Luce et al. | 148/187 |
| 4,046,606 | 9/1977 | Lambert | 148/187 |
| 4,074,304 | 2/1978 | Shiba | 357/59 |
| 4,075,045 | 2/1978 | Rideout | 148/187 |
| 4,110,125 | 8/1978 | Beyer | 148/1.5 |
| 4,140,548 | 2/1979 | Zimmer | 148/1.5 |

*Primary Examiner*—L. Dewayne Rutledge
*Assistant Examiner*—Upendra Roy
*Attorney, Agent, or Firm*—Alan H. MacPherson; Robert C. Colwell

[57] ABSTRACT

A process for forming the field dielectric regions in semiconductor structures without encroaching upon device areas includes the steps of forming an insulating layer on a surface of a semiconductor substrate, forming regions of selected material on the surface of said insulating layer, converting said regions of selected material to insulating material, and removing the insulating layer from the surface of the semiconductor substrate except where the insulating material overlies the insulating layer. Active and/or passive electronic devices may then be formed in the exposed regions of said semiconductor substrate using well known semiconductor processing technology. The combined insulating layer and insulating material will prevent field inversion from occuring in all of those regions of the semiconductor substrate on which the insulating layer and the insulating material are disposed.

10 Claims, 7 Drawing Figures

PROCESS FOR FORMING FIELD DIELECTRIC REGIONS IN SEMICONDUCTOR STRUCTURES WITHOUT ENCROACHING ON DEVICE REGIONS

BACKGROUND OF THE INVENTION

1. Field of the Invention

This invention relates to a process for forming the field dielectric regions in integrated circuit structures to thereby prevent inversion in the semiconductor substrate when electrically conducting materials are formed over the surface of said field dielectric regions.

2. Prior Art

Two techniques typically have been used by prior art semiconductor processing technology to fabricate the field dielectric regions in semiconductor structures. Unfortunately, both of these prior art techniques suffer from certain disadvantages. According to one technique a layer of field oxide is grown to the necessary thickness directly on the substrate, and the required field geometry is then achieved by etching the oxide. Unfortunately, it is difficult to etch the oxide with sufficiently precise control, particularly when small geometries are desired.

According to another prior art technique, silicon nitride is used as an oxidation mask for oxidation of the substrate to form thick regions of silicon dioxide. This technique suffers from the disadvantage of creating what are referred to as "bird beaks." The bird beaks are tapering regions of silicon dioxide which occur at the edge between the silicon dioxide field isolation regions and the silicon nitride oxidation mask. This tapering region of silicon dioxide tends to lift the silicon nitride masking layer away from the surface of the underlying substrate, making precise dimensional control difficult. An example of a prior art structure utilizing this technique is shown in FIG. 7. Note the lateral penetration X of the silicon dioxide beneath the silicon nitride layer. This penetration makes accurate control of the dimensions of the device region, designated Y in FIG. 7, difficult to achieve.

One further technique for generating the field dielectric has been attempted, but found generally impractical. According to this technique the field dielectric is created by vapor depositing silicon dioxide regions on the surface of the wafer and then suitably patterning them. Unfortunately, it has been found extremely difficult to fabricate such layers of silicon dioxide on the wafer surface with sufficient purity. Typically the vapor deposited silicon dioxide will have sodium impurities contained therein which defeat the function of the field dielectric. This technique has therefore never been widely used, and generally results in lower yields than the previously mentioned two techniques.

SUMMARY OF THE INVENTION

Applicant has discovered a process for fabricating the field dielectric layer without consuming portions of the substrate, without encroaching upon device regions, and without forming undesired impurities in the field dielectric. According to the process an insulating layer is first formed on a semiconductor substrate, regions of selected material are formed on the surface of the insulating layer, the regions of selected material are converted to regions of insulating material, the portions of the insulating layer not overlaid by the insulating material are then removed, and devices are then formed in the regions of the semiconductor substrate not overlaid by the insulating layer or the insulating material.

Typically the insulating layer will comprise a first layer of silicon dioxide and an overlying second layer of silicon nitride, while the selected material will be polycrystalline silicon which is converted to silicon dioxide by a silicon oxidation process. The portions of the insulating layer are removed using well known etching processes, and devices are formed using well known semiconductor fabrication techniques.

DETAILED DESCRIPTION

Figure 1:
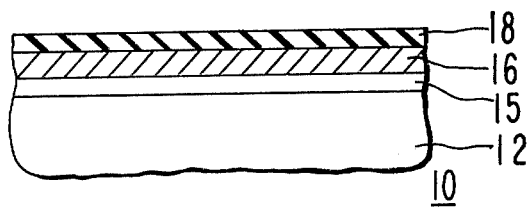
FIG. 1 shows in cross-section a silicon substrate, having formed thereon a layer of silicon dioxide, a layer of silicon nitride, and a layer of polycrystalline silicon.

The process of this invention may be accomplished using a sequence of steps, each one of which is known individually in the semiconductor fabrication arts. As shown in FIG. 1 a semiconductor substrate 12, typically P conductivity type, is oxidized to create a layer of silicon dioxide 15. Silicon dioxide 15 will typically be on the order of 400 Angstroms thick and may be formed on the surface of substrate 12 by oxidizing substrate 12 at 1000° C. If it is desired to further raise the threshold voltage of the field a boron field implant may be performed using well known ion implantation techniques after the formation of silicon dioxide layer 15. Next a layer of silicon nitride 16 is formed on the upper surface of silicon dioxide layer 15. Nitride layer 16 typically is formed by chemical vapor deposition, and in a typical embodiment is 1000 Angstroms thick. Next a layer of polycrystalline silicon 18 is formed on the surface of nitride 16. Polycrystalline silicon layer 18 may be formed by known chemical vapor deposition processes, and will be approximately half as thick as the eventually desired field dielectric. For example, if a 1.0 micrometer thick field dielectric layer is desired then polycrystalline layer 16 will be formed to be approximately 0.5 micrometers thick. The actual thickness will depend primarily upon the characteristics of whatever circuits or devices are to be formed subsequently in substrate 12.

Figure 2:
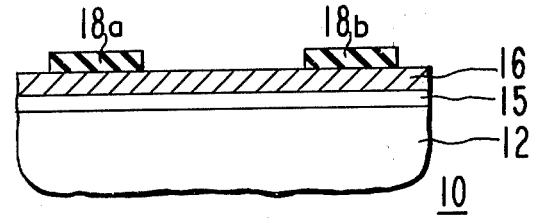
FIG. 2 shows the appearance of the structure depicted in FIG. 1 after the layer of polycrystalline silicon is appropriately patterned.

Next, as shown in FIG. 2, portions of polysilicon layer 18 are selectively removed from the surface of nitride 16. This is accomplished using well known photolithographic and etching techniques. and results in polycrystalline silicon regions 18a and 18b. Regions of polysilicon 18a and 18b will be allowed to remain on the wafer 10 surface wherever field dielectric regions are desired.

Figure 3:
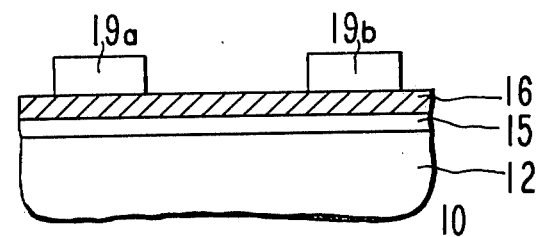
FIG. 3 is a further cross-sectional view showing the regions of polysilicon after they are oxidized to create silicon dioxide.

As shown in FIG. 3 polycrystalline silicon regions 18a and 18b then are completely oxidized and thereby converted into regions of silicon dioxide. Because silicon dioxide occupies approximately twice the volume of polycrystalline silicon, the polycrystalline silicon regions 18a and 18b will be converted into silicon dioxide regions 19a and 19b which are approximately twice as thick as the original polysilicon layer 18. In a typical embodiment polycrystalline layer 18 is converted to silicon dioxide 19 by heating the wafer 10 to 1000° C. for five hours in steam.

Figure 4:
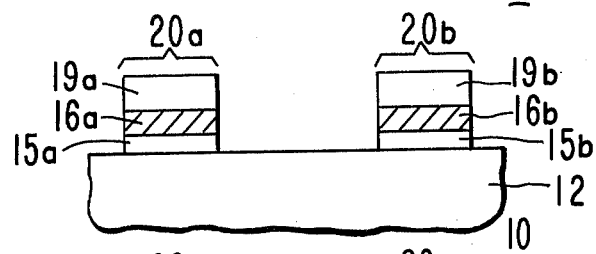
FIG. 4 is a further cross-sectional view showing the patterning of the underlying layers of silicon dioxide and silicon nitride using the overlying layer of silicon dioxide as a mask.

As shown in FIG. 4, the underlying regions of silicon nitride 16 and silicon dioxide 15 are then removed using regions 19a and 19b as a mask. The silicon nitride layer 16 may be etched using phosphoric acid, and the oxide layer 15 may be removed subsequently by etching with buffered hydrofluoric acid. The duration of the etching of the oxide 15 will depend on the thickness of oxide 15. Because the buffered acid will also etch the silicon dioxide regions 19a and 19b, reducing the thickness of these regions by a small amount, the etching of layer 15 usually will be continued only for a time sufficient to remove layer 15. For a silicon dioxide layer 15 which is 400 Angstroms thick, twenty seconds of etching in a solution of 25 milliliters hydrofluoric acid, 68 grams ammonium fluoride and 100 milliliters of water has been found sufficient.

After the foregoing process steps field dielectric regions 20a and 20b have been created and suitably patterned. Regions 20a and 20b will prevent the metal connections from being sufficiently close to the upper surface of substrate 10 to invert the field beneath layers 15a and 15b.

Figure 5:
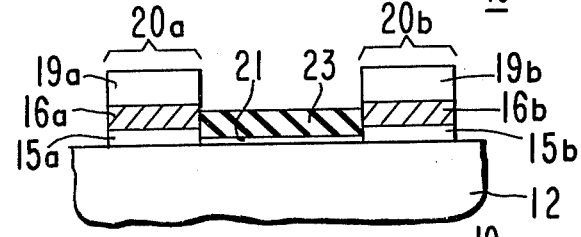
FIG. 5 is a further cross-sectional view showing the formation of a region of gate oxide and the gate electrode over one portion of the structure shown in FIG. 4.
Figure 6:
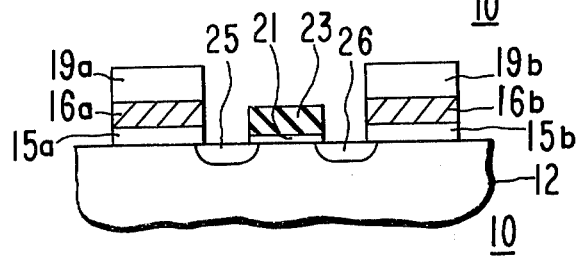
FIG. 6 is a further cross-sectional view showing the formation of the source and drain regions in the semiconductor structure.
Figure 7:
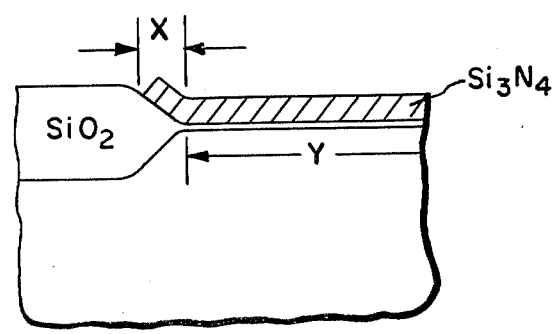
FIG. 7 is a cross-sectional view of a typical prior art technique for forming the field dielectric regions.

FIGS. 5 and 6 are provided for illustrative purposes to demonstrate the subsequent processing sequence used to fabricate an active device, that is, an MOS transistor, in the substrate 12 between field dielectric regions 20a and 20b. Of course, any well known semiconductor processing technique could also be utilized. As shown in FIG. 5 a thin region of silicon dioxide 21 is first formed on the surface of substrate 12. This oxide typically will be 1000 Angstroms thick and formed by heating the wafer 10 to 1000° C. for 120 minutes in dry oxygen. An overlying region of polycrystalline silicon 23, typically 4000 Angstroms thick, is then deposited. Oxide 21 will serve as the gate dielectric, while polycrystalline silicon 23 will serve as the gate electrode.

As shown in FIG. 6 layers 21 and 23 are suitably patterned using well known techniques to create a gate region of the desired width, and a suitable dopant is introduced into the surface of substrate 12 to create source and drain regions 25 and 26. In subsequent well known processing steps (not shown in the figures) wafer 10 is reoxidized, layers of phosphorus doped vapox are formed over the surface, and ohmic connections are made to the source 25, drain 26 and gate 23 regions using metal evaporated onto the surface of the wafer 10.

The process described above differs from prior art processes by using polycrystalline silicon, rather than the silicon substrate, as the source of silicon for the major thickness of the field dielectric layer of silicon dioxide. Such prior art techniques suffer from the disadvantages of requiring either the etching of very thick silicon dioxide layers or creating silicon dioxide layers which encroached upon device areas.

The process of this invention further has the advantage of leaving unaffected any field implant into the underlying substrate. Prior art structures typically required a field implant one or two orders of magnitude larger than the finished device charge density because much of the field implant was segregated into the thick field oxide which was created by oxidizing the substrate. In the process herein, the required field implant, if any, is approximately that needed to provide enhancement device threshold voltage control in gate oxide regions.

In one such embodiment of this invention substrate 12 will be P conductivity type silicon having 20 ohm-centimeter resistivity. The effective implant dose will be $2.2 \times 10^{11}$ boron ions/cm$^2$, and the gate oxide thickness will be 1000 Angstroms, resulting in a threshold voltage of about one volt, while the field oxide thickness will be about 1.0 micrometers resulting in a threshold voltage of approximately 20 volts.

What is claimed is:

1. A process for forming field dielectric regions on a semiconductor substrate comprising:
    forming an insulating layer on the semiconductor substrate,
    forming regions of selected material on said insulating layer wherever the field dielectric regions are desired,
    converting the selected material to insulating material, and
    removing the insulating layer from the substrate except where the regions of insulating material overly the insulating layer.

2. A process as in claim 1 wherein the insulating layer comprises a second layer formed on the surface of a first layer.

3. A process as in claim 2 wherein the second layer is silicon nitride and the first layer is silicon dioxide.

4. A process as in claim 1 wherein the selected material is polycrystalline silicon.

5. A process as in claim 4 wherein the insulating material is silicon dioxide and the conversion of the polycrystalline silicon to silicon dioxide is accomplished by thermal oxidation.

6. A process as in claim 1 wherein the step of removing the insulating layer is performed by at least one etching process.

7. A process as in claim 1 further including the step of forming electronic devices in the substrate between the regions of insulating material.

8. A process as in claim 1 wherein:
    the insulating layer comprises a layer of silicon nitride formed on a layer of silicon dioxide,
    the selected material is polycrystalline silicon, and
    the insulating material is silicon dioxide.

9. A process as in claim 8 wherein the polycrystalline silicon is converted to silicon dioxide by thermal oxidation.

10. A process as in claim 3 wherein a dopant is introduced into the substrate after the silicon dioxide layer is formed and before the silicon nitride layer is formed.

* * * * *